United States Patent [19]
Ishida et al.

[11] Patent Number: 6,127,624
[45] Date of Patent: Oct. 3, 2000

[54] PHOTORESPONSIVE ELECTRODE AND WET SOLAR CELL

[75] Inventors: Akito Ishida, Osaka; Yoshiteru Sakata, Kyoto; Hiroshi Imahori; Tsuyoshi Akiyama, both of Osaka, all of Japan

[73] Assignee: Japan Science and Technology Corporation, Saitama, Japan

[21] Appl. No.: 09/092,306

[22] Filed: Jun. 5, 1998

[30] Foreign Application Priority Data

Jun. 5, 1997 [JP] Japan .................................. 9-147448

[51] Int. Cl.[7] .............................................. H01L 31/0232
[52] U.S. Cl. ........................................ 136/257; 136/252
[58] Field of Search ................................... 136/249, 263, 136/265, 248, 246, 252, 254, 256, 257; 204/280, 400, 403

[56] References Cited

U.S. PATENT DOCUMENTS

| | | | |
|---|---|---|---|
| 3,935,031 | 1/1976 | Adler | 136/206 |
| 4,164,431 | 8/1979 | Tang | 136/89 |
| 4,255,501 | 3/1981 | Osa et al. | 429/111 |
| 4,281,053 | 7/1981 | Tang | 430/58 |
| 4,379,202 | 4/1983 | Chalmers | 136/256 |
| 4,385,102 | 5/1983 | Fitzgy et al. | 429/111 |
| 4,473,484 | 9/1984 | Taoda et al. | 252/70 |
| 4,543,099 | 9/1985 | Howe | 29/572 |
| 4,829,013 | 5/1989 | Yamazaki | 437/2 |
| 5,123,968 | 6/1992 | Fraas et al. | 136/246 |
| 5,232,574 | 8/1993 | Saika et al. | 204/418 |
| 5,677,236 | 10/1997 | Saitoh et al. | 437/109 |
| 5,795,453 | 8/1998 | Gilmartin | 204/403 |
| 5,830,341 | 11/1998 | Gilmartin | 205/777.5 |
| 5,858,799 | 1/1999 | Yee et al. | 436/164 |

*Primary Examiner*—Nam Nguyen
*Assistant Examiner*—Michael C. Miggins
*Attorney, Agent, or Firm*—Wenderoth, Lind & Ponack, L.L.P.

[57] ABSTRACT

A photoresponsive electrode for a wet solar cell wherein on a metal film having fixed thereon a photoresponsive molecule such as, for example, a porphyrin derivative, there is fixed by vapor deposition a light-irradiating portion such as a prism or optical fibers, and the metal film is irradiated with a light via the light-irradiating portion at about the resonance incident angle θ of inducing surface plasmon resonance in the interface between the metal film and the light-irradiating portion, and a wet solar cell using the photoresponsive electrode. In the photoresponsive electrode, the reflection of the incident light at the metal film can be restrained and the photoresponsive molecule can be efficiently excited even by sunlight of a low energy and the wet solar cell has a very excellent photoelectric transformation efficiency.

16 Claims, 7 Drawing Sheets

Fig. 3
(a)
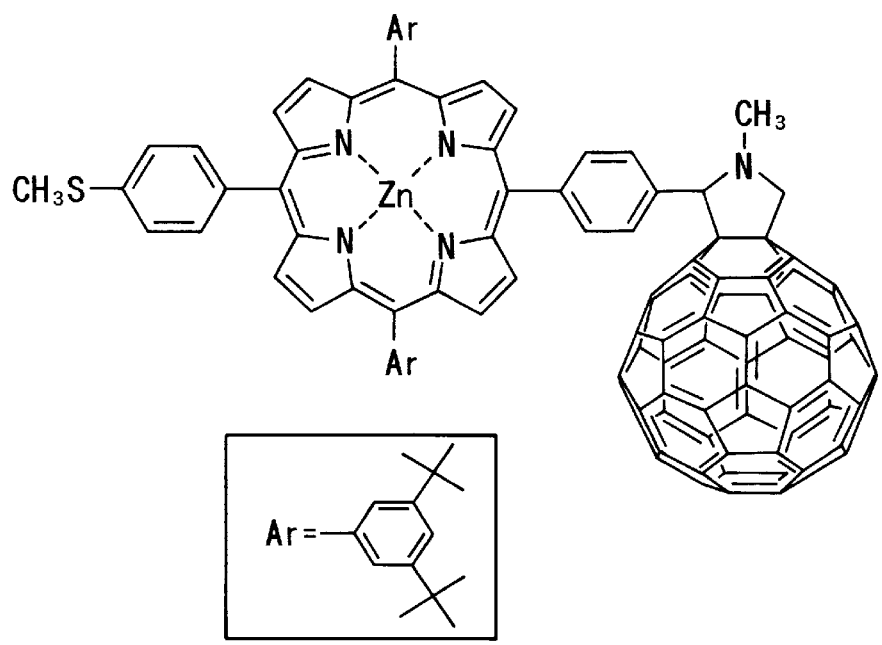
(b)
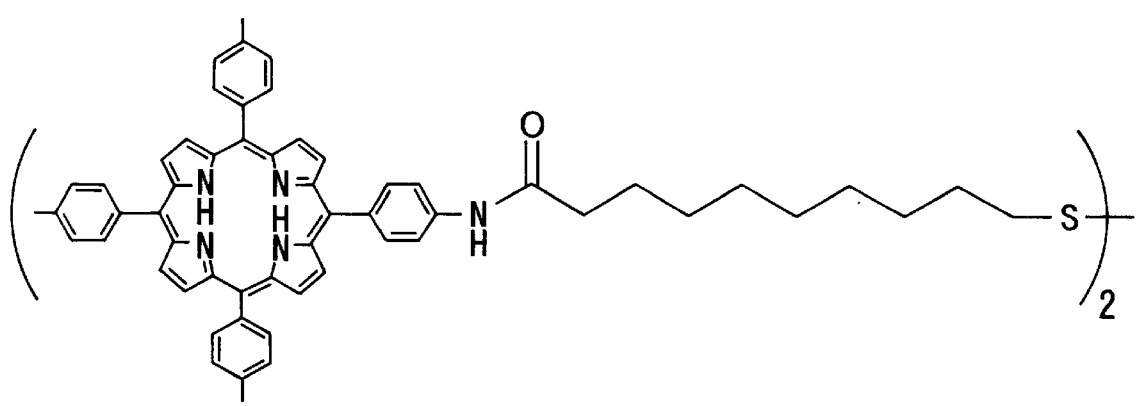

006,127,624

PHOTORESPONSIVE ELECTRODE AND WET SOLAR CELL

FIELD OF THE INVENTION

The present invention relates to a photoresponsive electrode and a wet solar cell using the photoresponsive electrode.

BACKGROUND OF THE INVENTION

In a wet solar cell, a photoresponsive electrode which is an electrode for responding to light and a counter electrode are fixed in an electrolyte and by irradiating the photoresponsive electrode with light, a photoelectric current is generated between the photoresponsive electrode and the counter electrode to obtain an electromotive force.

Such a wet solar cell has been vigorously investigated as a solar cell capable of obtaining a high photoelectric transformation efficiency and, in particularly, a wet solar cell using a photoresponsive electrode formed by fixing various organic molecules onto the surface of a metal is expected to be able to attain a very high photoelectric transformation efficiency by designing high-performance photoresponsive molecules and by controlling the orientation of the molecules, and thus the investigation and development of the wet solar cell have been vigorously made.

However, because in a conventional wet solar cell, such a photoresponsive electrode is directly irradiated with light, a major part of the incident light is reflected at the metal surface of the photoresponsive electrode and only a part of the irradiated light excites the photoresponsive molecule on the surface of the metal to generate a photoelectric current, which becomes a factor of preventing the remarkable improvement of the photoelectric transformation efficiency.

Also, the sunlight has a broad spectrum of from ultraviolet to infrared, and in these wavelengths of the sunlight, the wavelengths of the highest average radiation intensity on the surface of the earth are the wavelengths of a red light of about 700 nm. However, a conventional photoresponsive electrode mainly responds to the light of from purple to green having wavelengths of from about 400 to 500 nm and thus by a red light having a low energy, the exciting efficiency of the photoresponsive electrode is greatly lowered, which causes the problem that the amount of the electric power generated by the low energy light is lowered to reduce the electric power generation and the stability of the solar cell using the conventional photoresponsive electrode.

SUMMARY OF THE INVENTION

Accordingly, the present invention has been made in view of the above-described circumstances, and an object of the present invention is to provide a novel photoresponsive electrode which restrains the reflection of an incident light at the surface of a metal film, and also excites the photoresponsive molecules at a good efficiency even by the sunlight of a low energy. Another object of the present invention is to provide a novel wet solar cell using the above-described photoresponsive electrode, which has a very excellent photoelectric transformation efficiency.

In the photoresponsive electrode of the present invention, on a metal film having fixed thereto a photoresponsive molecule is fixed by vapor deposition a light-irradiating portion having a different dielectric constant from the dielectric constant of the metal film and a light is irradiated onto the surface of the metal film via the light-irradiating portion at a substantial resonance incident angle of inducing a surface plasmon resonance at the interface between the light-irradiating portion and the surface of the metal film.

The surface plasmon resonance which is important in the photoresponsive electrode of the present invention is the phenomenon that when two kinds of media each having a different dielectric constant are struck by a light at a specific resonance angle, a local electric field is formed in the interface between the two kinds of media, as well as on the outer surface of a metal. The local electric field formed causes a strong interaction with only the photoresponsive molecule fixed to the surface of a metal. Also, the photoresponsive molecule placed in the local electric field is electronically-excited simultaneously with the irradiation of the light.

Accordingly, by utilizing such surface plasmon resonance, the photoresponsive molecule fixed to the metal surface of the photoresponsive electrode can be very efficiently excited. Furthermore, because by a red light having a long wavelength, the intensifying effect of the electric field in the local electric field formed by the surface plasmon resonance is increased, by utilizing such a phenomenon, even by a red light of a low energy contained much in the sunlight, the photoresponsive molecule can be excited with a good efficiency.

BRIEF DESCRIPTION OF THE DRAWINGS

The foregoing objects, features and advantages of the present invention will be better understood from the following detailed description, taken in conjunction with the accompanying drawings, in which.

DETAILED DESCRIPTION OF THE INVENTION

Figure 1:
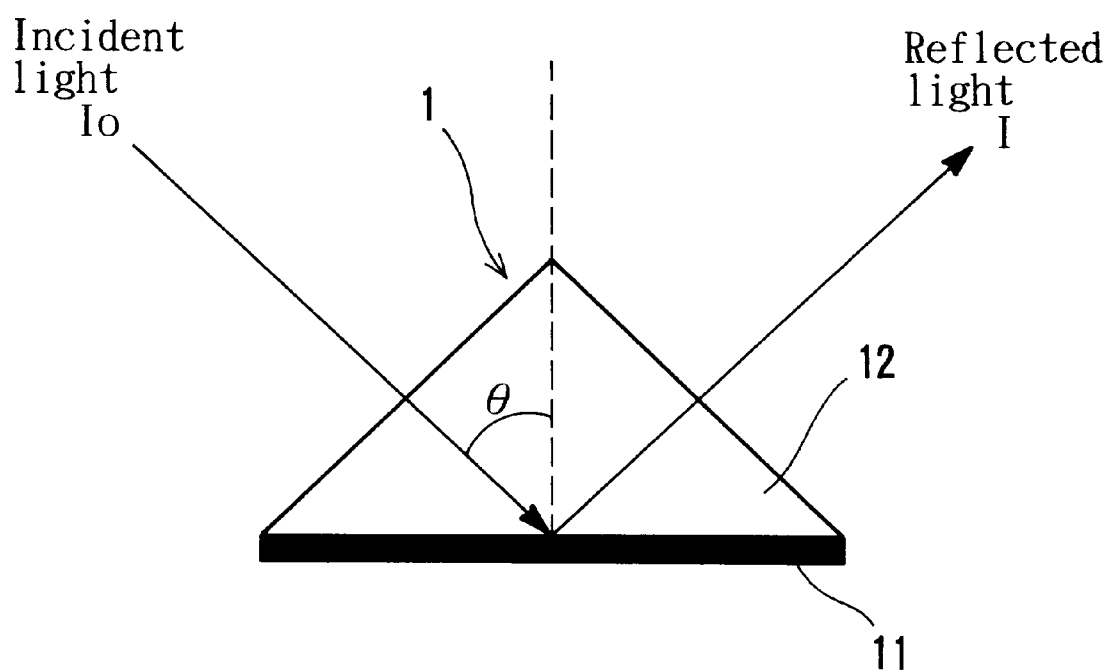
FIG. 1 is a cross-sectional view showing an embodiment of the photoresponsive electrode of the present invention.

FIG. 1 shows an embodiment of the photoresponsive electrode of the present invention.

In a photoresponsive electrode (1) illustrated in FIG. 1, a photoresponsive molecule is fixed to a metal film (11), a glass-made prism (12) having a triangle-form cross section is placed on the metal film (11) as a light-irradiating portion such that the bottom surface of the prism is in contact with the surface of the metal film (11) and fixed thereon by vapor deposition.

Figure 2:
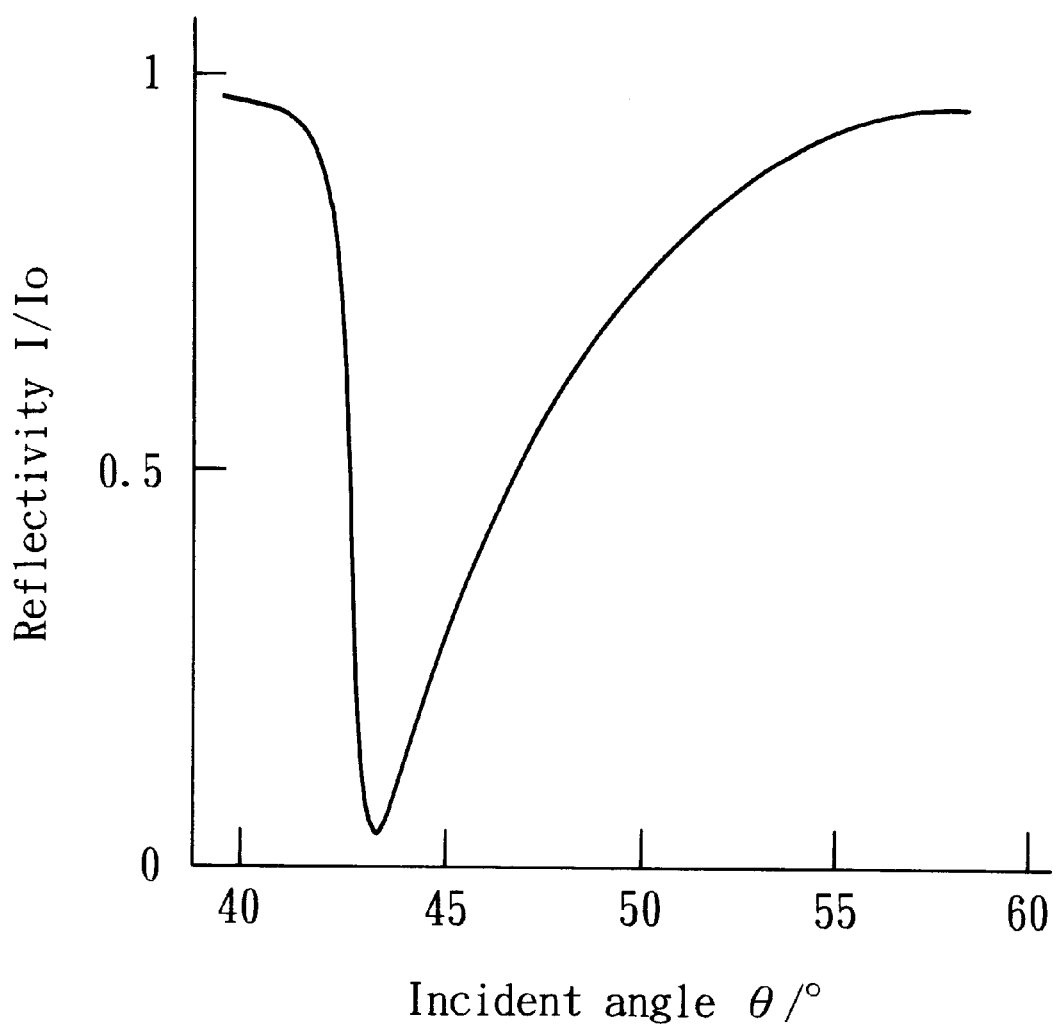
FIG. 2 is a graph illustrating the relation of the incident angle of an incident light and the reflectivity, FIG. 3 (*a*) and (*b*) each is a view illustrating the porphyrin derivative in the present invention.

When the metal film (11) of such a photoresponsive electrode (1) is irradiated by a light having an intensity $I_0$ via the prism (12) at an incident angle θ, in a specific incident angle θ, the surface plasmon resonance is induced in the interface between the metal film (11) and the prism (12) to greatly lower the reflectivity $I/I_0$ as shown in FIG. 2, that is, the intensity of the reflected light is greatly lowered.

Accordingly, for example, in the photoresponsive electrode (1) shown in FIG. 1, by irradiating the surface of the metal film (11) with a light by striking the light from an optional surface of the prism(12) at the resonance incident angle θ of inducing the surface plasmon resonance in the interface between the metal film (11) and the prism (12), the incident light is consumed by the surface plasmon resonance, whereby in the local electric field formed in the interface between the metal film (11) and the prism (12) by the surface plasmon resonance, the photoresponsive molecule can be very efficiently excited.

Also, because as described above, by a red light having a long wavelength, the intensifying effect of an electric field is increased in the local electric field formed by the surface plasmon resonance, even when the photoresponsive electrode is irradiated by a red light of a lower energy contained much in the sunlight, the photoresponsive molecule can be excited with a good efficiency.

Now, because in the present invention, it was preferred to use a photoresponsive molecule capable of being strongly fixed with the metal film, the inventor of the present invention synthesized a series of porphyrin derivatives which could undergo strong chemical bonding with metals such as gold, silver, copper, aluminum, etc., as the photoresponsive molecules being fixed onto the surface of the metal film of the photoresponsive electrode. FIG. 3 (a) and (b) each shows an example of the porphyrin derivatives. The porphyrin derivative of FIG. 3 (a) was synthesized by bonding an electron acceptor $C_{60}$ to porphyrin. The porphyrin derivative of FIG. 3 (b) was synthesized by bonding porphyrin with disulfide.

These porphyrin derivatives have a feature of liable to be dissolved in an organic solvent. Thus, for example, by immersing a metal film made up of gold, silver, copper, aluminum, etc., in a solution having dissolved therein the porphyrin derivative for several hours or several days at room temperature, a metal-sulfur bond is formed, whereby the porphyrin derivative can be strongly and easily fixed on the surface of the metal film.

Figure 4:
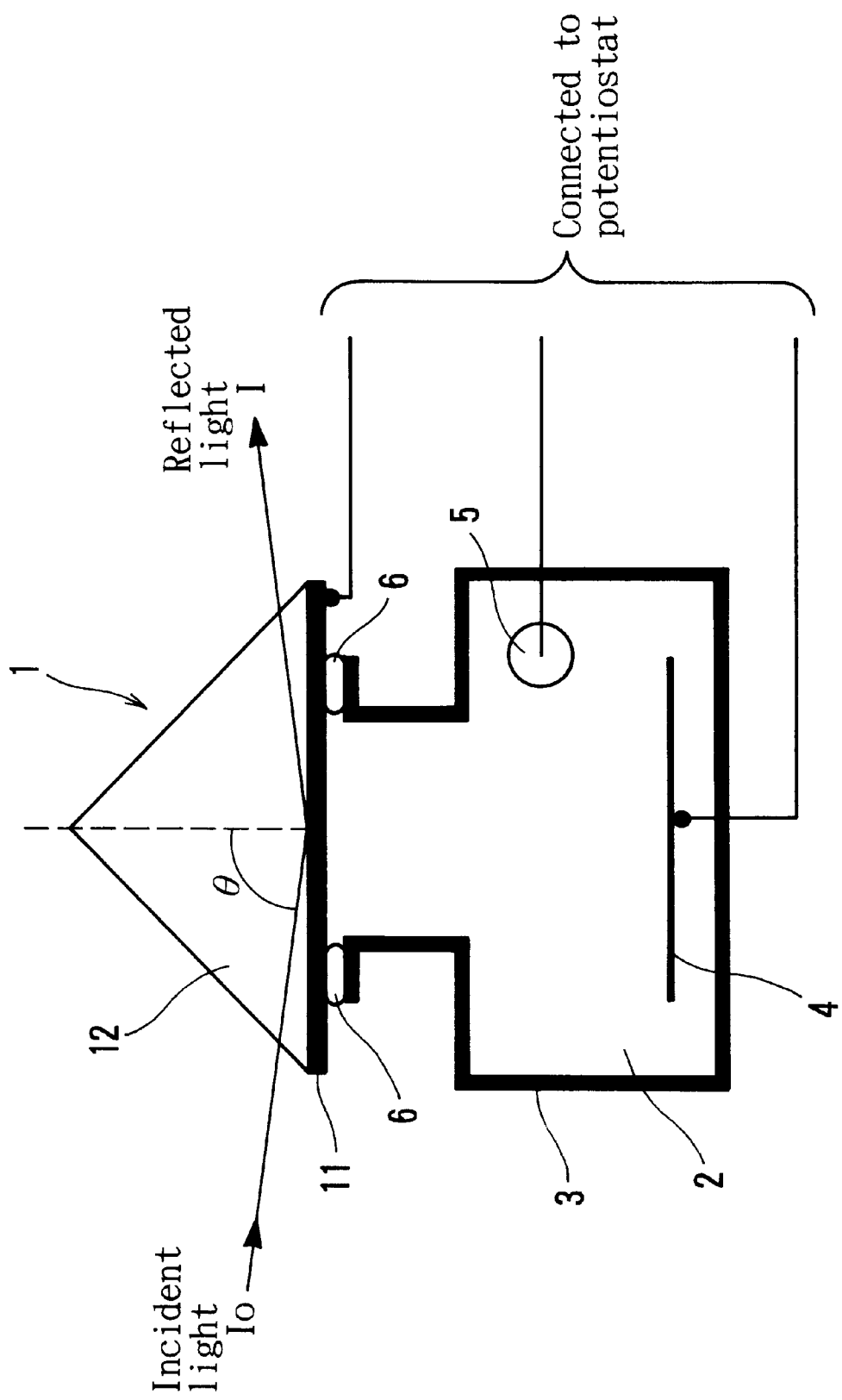
FIG. 4 is a schematic view of the essential construction illustrating the wet solar cell of the present invention using the photoresponsive electrode of FIG. 1.

FIG. 4 is a schematic cross-sectional view illustrating a wet solar cell of the present invention using the photoresponsive electrode (1) illustrated in FIG. 1.

In the wet solar cell illustrated in FIG. 4, a counter electrode (4) made up of platinum, etc., and a reference electrode (5) made up of silver-silver chloride, etc., are disposed in a cell (3) filled with an electrolyte (2) and a photoresponsive electrode (1) is disposed on the cell (3) via an O-ring (6) such that the metal film (11) is disposed facing the counter electrode (4). Also, the photoresponsive electrode (1), the counter electrode (4), and the reference electrode (5) each is connected to a potentiostat.

By immersing the metal film (11) of the photoresponsive electrode (1) in a solution of a porphyrin derivative, the porphyrin is strongly fixed on the surface thereof as a photoresponsive molecule. As the matter of course, as the photoresponsive molecule, not only the porphyrin derivative as described above but also various kinds of organic molecules and metal complexes can be used.

In such a wet solar cell, a light is struck onto the metal film (11) of the photoresponsive electrode (1) via the prism (12) at a resonance incident angle θ. For example, when the electrolyte (2) filled in the cell (3) is an aqueous medium, the resonance angle θ is from 70° to 85°.

The incident light at the resonance incident angle θ induces the surface plasmon resonance in the interface between the metal film (11) and the prism (12), whereby a major part of the light is consumed for the surface plasmon resonance. Accordingly, as compared with a conventional wet solar cell, in the wet solar cell of the present invention, the utilization efficiency of the incident light is greatly improved and the photoresponsive molecule fixed to the metal film (11) is excited by a major part of the incident light to generate very much photoelectric current between the metal film (11) and the counter electrode (4). Also, even by a red light of a low energy much contained in the sunlight, the photoresponsive molecule can be efficiently excited. Thus, by the wet solar cell of the present invention, an electromotive force can be very efficiently obtained.

Now, in the photoresponsive electrode (1) of the present invention equipped with the glass prism (12) having a triangle form cross section illustrated in FIG. 1 and FIG. 4, by irradiating a light at the resonance incident angle θ of inducing the surface plasmon resonance, a major part of the incident light can be utilized for the photoelectric transformation but a part of the incident light is still reflected.

Figure 5:
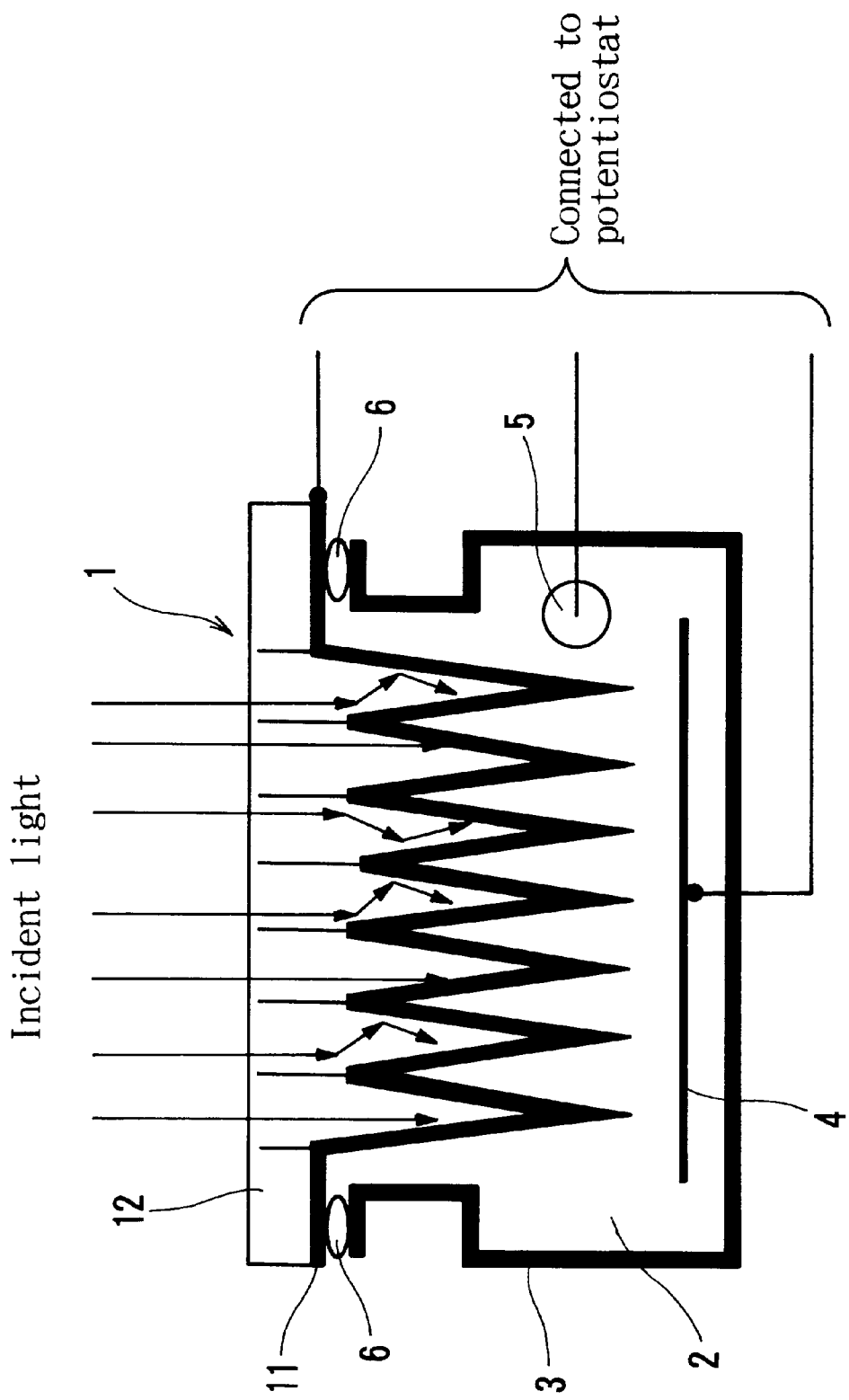
FIG. 5 is a schematic view of the essential construction illustrating another embodiment of the wet solar cell of the present invention.

Accordingly, to utilize the incident light more, the wet solar cell using the photoresponsive electrode (1) as illustrated in FIG. 5 may be used.

The photoresponsive electrode (1) in the wet solar cell illustrated in FIG. 5 has the construction that the prism (12) has a multiple reflective portion formed by successively connecting plural cross-sectional wedge-form portions or plural conical form portions, the metal film (11) also has a multiple reflective portion formed by successively connecting plural cross-sectional wedge-form portions or plural conical portions of the form corresponding to the multiple reflective portion of the prism (12), and the multiple reflective portion of the prism (12) is in contact with the multiple reflective portion of the metal film (11).

In the photoresponsive electrode (1) having the construction described above, the reflected light reflected by the optional cross-sectional wedge-form portion or the optional conical portion in the multiple reflective portion of the metal film (11) is made to fall again onto another cross-sectional wedge-form portion or conical portion disposed at the opposite side to induce the surface plasmon resonance and such an incidence and reflection are repeated many times in the multiple reflective portion, whereby finally all the light is utilized for the induction of the surface plasmon resonance and a higher photoelectric transformation efficiency can be obtained.

Furthermore, because in the photoresponsive electrode (1) of the above-described construction, the portions in which the photoresponsive molecule is excited are formed in the cross-sectional wedge forms or conical forms, in corporation with the increasing effect of the surface area, the photoelectric current generating efficiency per unit volume is greatly improved as compared with a conventional wet solar cell.

Figure 6:
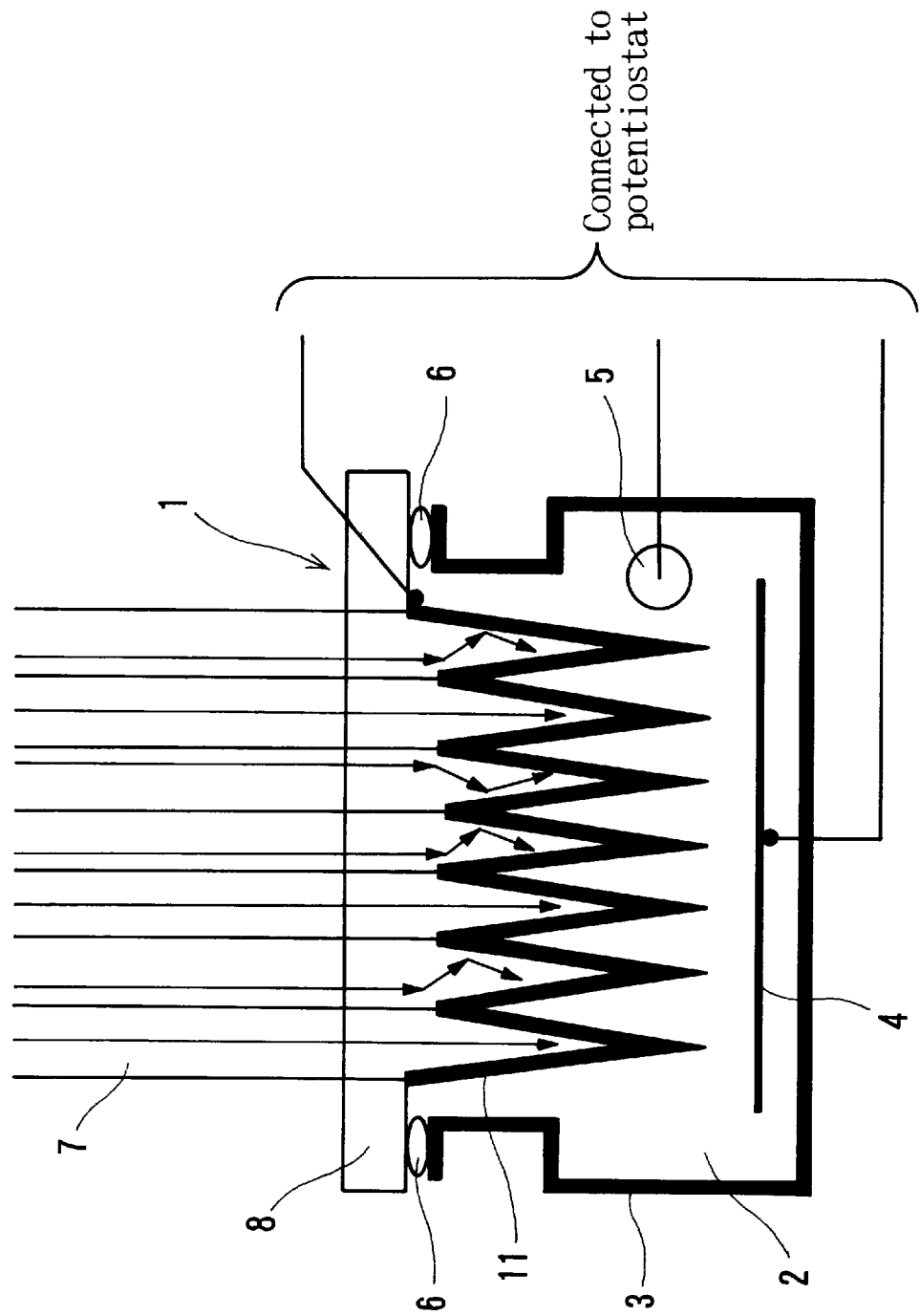
FIG. 6 is a schematic view of the essential construction illustrating a still another embodiment of the wet solar cell of the present invention.

Also, as the light-irradiating portion of the photoresponsive molecule, in place of the prism(12) having the form illustrated in FIG. 1, FIG. 4, and FIG. 5, optical fibers (7) as illustrated in FIG. 6 can be used. In this case, for example, a construction can be employed such that the lower end of each optical fiber (7) is shaped into a conical form by etching, heating, etc., a metal film (11) has conical portions, and the conical lower ends of the optical fibers (7) are in contact with the conical portions of the metal film (11). In the photoresponsive electrode (1) of the wet solar cell illustrated in FIG. 6, the optical fibers (7) are held by an airtight stopper (8) formed on the metal film (11).

In the wet solar cell of the present invention using the photoresponsive electrode (1) directly connected to the optical fibers (7) as described above, because a sunlight concentrating instrument, etc., using optical fibers (7) can be directly connected thereto, by effectively utilizing the incident light in such a manner that the photoresponsive electrode (1) is struck by the light passed through the optical fibers (7) at the resonance incident angle θ to induce the surface plasmon resonance, the light from the optical fibers (7) can be more efficiently utilized. As a matter of course, even in this case, by plural optical fibers (7) are used to perform multiple reflections of the incident light, whereby a higher photoelectric transformation efficiency can be obtained.

Also, in the above-described explanation, a light is irradiated at the resonance incident angle θ of inducing the surface plasmon resonance but as a matter of course, even when a light is irradiated at an incident angle near the resonance incident angle θ, such as, for example, θ±10°, the occurrence of the reflected light is reduced and a superior photoelectric transformation efficiency to a conventional case can be obtained.

Now, a photoelectric current was observed in the wet solar cell of the present invention illustrated in FIG. 5; a photoresponsive electrode was used as the working electrode, a platinum as the counter electrode, and a silver-silver chloride electrode as the reference electrode, and these electrodes were connected to potentiostat. Also, an aqueous 0.1 M sodium sulfate solution having dissolved therein 0.1 mM of methylviologen as an electron acceptor was placed in the cell (3) as the electrolyte (2), and the metal film (11) was irradiated with a light via the prism (12) using a transverse polarizing helium-neon laser of 10 mM.

Figure 7:
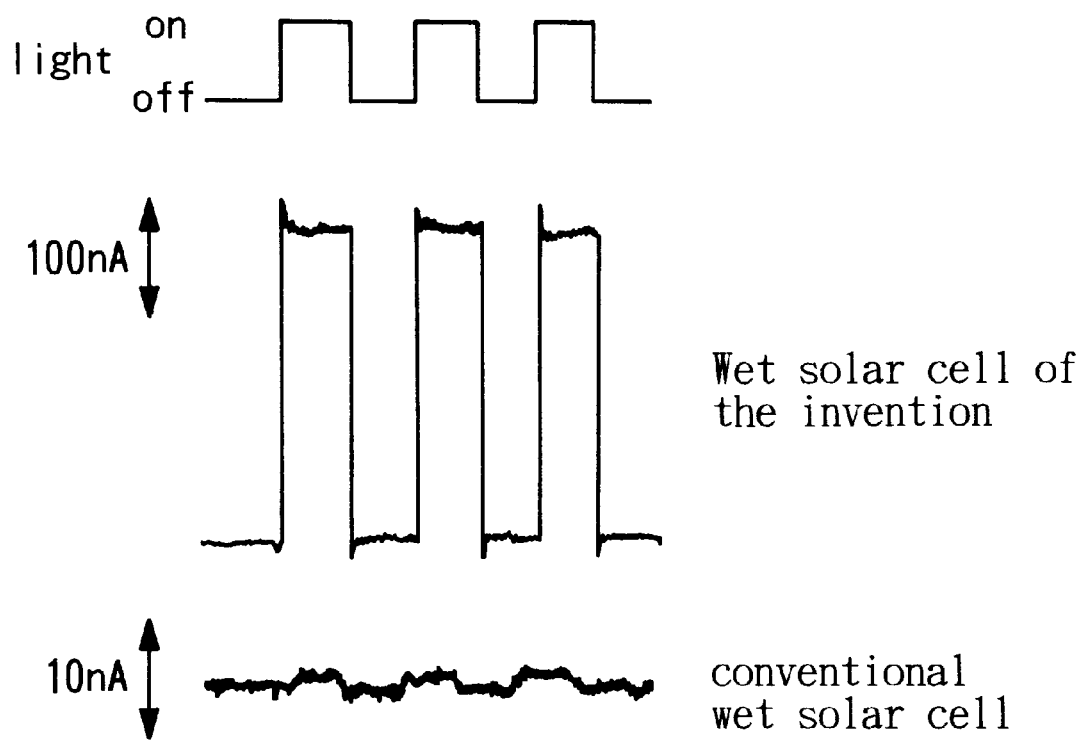
FIG. 7 is a view illustrating the photoelectric current by the wet solar cell of the present invention and the photoelectric current of a conventional wet solar cell.

FIG. 7 shows the photoelectric current generated by the wet solar cell of the present invention and a photoelectric current generated by a conventional wet solar cell.

As is clear from FIG. 7, the wet solar cell of the present invention is very excellent in the response to on/off of the incident light and generates the photoelectric current of about 100 times the photoelectric current generated by the conventional wet solar cell.

As described above in detail, according to the present invention, there is provided a novel photoresponsive electrode which can restrain the reflection of an incident light on the surface of the metal film, can excite the photoresponsive molecule with a good efficiency not only by the sunlight of a high energy but also by the sunlight of a low energy, and has a very high utilization efficiency of an incident light, and also there is provided a novel wet solar cell having a very excellent photoelectric transformation efficiency and capable of obtaining an electromotive force with a very high efficiency by using the above-described photoresponsive electrode.

While the invention has been described in detail and with reference to specific embodiments thereof, it will be apparent to one skilled in the art that various changes and modifications can be made therein without departing from the spirit and scope thereof.

What is claimed is:

1. A photoresponsive electrode used for a wet solar cell, which comprises:
   a metal film capable of giving a surface plasmon energy to a photoresponsive molecule at occurrence of a surface plasmon resonance;
   the photoresponsive molecule being fixed on the metal film by chemical reaction using a metal-sulfur bond and being capable of excitation by the surface plasmon energy; and
   a light-irradiating portion fixed on the metal film and having a dielectric constant different from that of the metal film;
   wherein the metal film has a thickness capable of satisfying conditions of the surface plasmon resonance with respect to a refractive index of the light-irradiating portion, and when the metal film is irradiated, through the light-irradiating portion, with a p-polarized light at a resonance incident angle, the surface plasmon resonance is induced in an interface between the metal film and the light-irradiating portion.

2. A photoresponsive electrode of claim 1, wherein the photoresponsive molecule is a porphyrin derivative.

3. A photoresponsive electrode of claim 1 or 2, wherein the light-irradiating portion is composed of optical fibers.

4. A photoresponsive electrode of claim 3, wherein a lower end of each of the optical fibers has a conical form, the metal film has conical portions, and the lower end of each optical fiber is in contact with each conical portion of the metal film.

5. A photoresponsive electrode of claim 1, wherein the light-irradiating portion is a prism.

6. A photoresponsive electrode of claim 5, wherein the prism has a cross-sectional triangle form and a bottom of the prism is in contact with an upper surface of the metal film.

7. A photoresponsive electrode of claim 5, wherein the prism has a multiple reflective portion formed by successively connecting plural cross-sectional wedge-form portions, the metal film has a multiple reflective portion formed by successively connecting plural cross-sectional wedge-form portions of a form corresponding to the multiple reflective portion of the prism, and the multiple reflective portion of the prism is in contact with the multiple reflective portion of the metal film.

8. A photoresponsive electrode of claim 5, wherein the prism has a multiple reflective portion formed by successively connecting plural conical portions, the metal film has a multiple reflective portion formed by successively connecting plural conical portions of a form corresponding to the multiple reflective portion of the prism, and the multiple reflective portion of the prism is in contact with the multiple reflective portion of the metal film.

9. A wet solar cell using a photoresponsive electrode, said photoresponsive electrode comprising:
   a metal film capable of giving a surface plasmon energy to a photoresponsive molecule at occurrence of a surface plasmon resonance;
   the photoresponsive molecule being fixed on the metal film by chemical reaction using a metal-sulfur bond and being capable of excitation by the surface plasmon energy; and
   a light-irradiating portion fixed on the metal film and having a dielectric constant different from that of the metal film;
   wherein the metal film has a thickness capable of satisfying conditions of the surface plasmon resonance with respect to a refractive index of the light-irradiating portion, and when the metal film is irradiated, through the light-irradiating portion, with a p-polarized light at a resonance incident angle, the surface plasmon resonance is induced in an interface between the metal film and the light-irradiating portion.

10. A solar cell of claim 9, wherein in the photoresponsive electrode, the photoresponsive molecule is a porphyrin derivative.

11. A solar cell of claim 9 or 10, wherein in the photoresponsive electrode, the light-irradiating portion is a prism.

12. A solar cell of claim 9 or 10, wherein in the photo-responsive electrode, the light-irradiating portion is composed of optical fibers.

13. A solar cell of claim 12, wherein in the photoresponsive electrode, the lower end of each of the optical fibers has a conical form, the metal film has conical portions, and the lower end of each optical fiber is in contact with each conical portion of the metal film.

14. A solar cell of claim 11, wherein in the photoresponsive electrode, the prism has a cross-sectional triangle form and a bottom surface of the prism is in contact with a surface of the metal film.

15. A solar cell of claim 11, wherein in the photoresponsive electrode, the prism has a multiple reflective portion formed by successively connecting plural cross-sectional wedge-form portions, the metal film has a multiple reflective portion formed by successively connecting plural cross-sectional wedge-form portions of a form corresponding to the multiple reflective portion of the prism, and the multiple reflective portion of the prism is in contact with the multiple reflective portion of the metal film.

16. A solar cell of claim 11, wherein in the photoresponsive electrode, the prism has a multiple reflective portion formed by successively connecting plural conical portions, the metal film has a multiple reflective portion formed by successively connecting plural conical portions of the form corresponding to the multiple reflective portion of the prism, and the multiple reflective portion of the prism is in contact with the multiple reflective portion of the metal film.

* * * * *